(12) United States Patent
Ahn et al.

(10) Patent No.: US 11,751,420 B2
(45) Date of Patent: Sep. 5, 2023

(54) DISPLAY DEVICE CAPABLE OF FACILITATING SUBSTRATE BONDING WITH ALIGNMENT KEY AND METHOD OF FABRICATING THE SAME

(71) Applicant: Samsung Display Co., Ltd., Yongin-Si (KR)

(72) Inventors: Jea Heon Ahn, Hwaseong-si (KR); Jang Soo Kim, Asan-si (KR); Jong Hoon Kim, Seoul (KR); Seong Yeon Lee, Asan-si (KR); Si Wan Jeon, Hwaseong-si (KR); Seok Joon Hong, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 53 days.

(21) Appl. No.: 17/341,525

(22) Filed: Jun. 8, 2021

(65) Prior Publication Data
US 2021/0399254 A1 Dec. 23, 2021

(30) Foreign Application Priority Data
Jun. 22, 2020 (KR) .......................... 10-2020-0075704

(51) Int. Cl.
*H10K 50/842* (2023.01)
*H10K 71/00* (2023.01)

(52) U.S. Cl.
CPC ......... *H10K 50/8428* (2023.02); *H10K 71/00* (2023.02)

(58) Field of Classification Search
None
See application file for complete search history.

(56) References Cited

U.S. PATENT DOCUMENTS

| 2006/0049408 A1* | 3/2006 | Sohn ..................... G02F 1/1333 257/72 |
| 2012/0287525 A1 | 11/2012 | Matsui et al. |
| 2017/0194397 A1* | 7/2017 | Kim ..................... H01L 27/3246 |
| 2019/0131359 A1* | 5/2019 | Kong ................. G02F 1/136286 |

(Continued)

FOREIGN PATENT DOCUMENTS

| CN | 111458920 A | 7/2020 |
| EP | 0881077 A2 | 12/1998 |
| EP | 0902315 A2 | 3/1999 |

(Continued)

*Primary Examiner* — Daniel Whalen
(74) *Attorney, Agent, or Firm* — Innovation Counsel LLP

(57) ABSTRACT

A display device is provided. An embodiment of a display device includes a first substrate, a second substrate disposed on the first substrate, first and second partition walls disposed on the second substrate, the second partition wall being disposed outside the first partition wall, a first trench disposed inside the first partition wall and having a first width, a second trench disposed between the first and second partition walls and having a second width greater than the first width; an alignment key disposed to overlap the second trench; a first spacer disposed on the alignment key, and a sealing member disposed along an edge between the first substrate and the second substrate without overlapping the alignment key, wherein the first spacer partially overlaps the first partition wall, the second partition wall, and the sealing member.

16 Claims, 16 Drawing Sheets

(56) References Cited

U.S. PATENT DOCUMENTS

2019/0155094 A1* 5/2019 Kim .................. G02F 1/1368

FOREIGN PATENT DOCUMENTS

| EP | 2950121 A2 | 12/2015 |
| JP | 2019-008962 A | 1/2019 |
| KR | 10-1983214 B1 | 5/2019 |
| KR | 10-2019-0062654 A | 6/2019 |
| KR | 10-1985481 B1 | 6/2019 |
| KR | 10-2056666 B1 | 12/2019 |

* cited by examiner

DISPLAY DEVICE CAPABLE OF FACILITATING SUBSTRATE BONDING WITH ALIGNMENT KEY AND METHOD OF FABRICATING THE SAME

CROSS-REFERENCE TO RELATED APPLICATION

This application claims priority from Korean Patent Application No. 10-2020-0075704 filed on Jun. 22, 2020, in the Korean Intellectual Property Office, and all the benefits accruing therefrom under 35 U.S.C. 119, the contents of which in its entirety are herein incorporated by reference.

BACKGROUND

1. Technical Field

Particularly, the present disclosure relates to a display device and a method of fabricating the same. More particularly, the present disclosure relates to a display device capable of facilitating substrate bonding with an alignment key and a method of fabricating the same.

2. Description of the Related Art

Recently, the importance of display devices has steadily increased with the development of multimedia technology. Accordingly, various types of display devices such as a liquid crystal display (LCD), an organic light emitting display (OLED) and the like have been used widely.

Among the display devices, a self-light emitting display device includes a self-light emitting element such as an organic light emitting diode. Generally, the self-light emitting element may include two opposite electrodes and a light emitting layer interposed therebetween. In the case of using the organic light emitting diode as the self-light emitting element, the electrons and holes from the two electrodes are recombined in the light emitting layer to produce excitons, which transit from the excited state to the ground state, emitting light.

Such a self-light emitting display device is attracting attention as a next-generation display device because of being able to meet the high display quality requirements such as wide viewing angle, high brightness and contrast, and quick response speed as well as being able to be made having a low power consumption, lightweight, and thin due to no necessity of a separate power source.

SUMMARY

Aspects of the present disclosure provide a display device capable of facilitating substrate bonding with an alignment key that is easily visible from a front surface of a substrate and a method of fabricating the display device.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

An embodiment of a display device includes a first substrate; a second substrate disposed on the first substrate; first and second partition walls disposed on the second substrate, the second partition wall being disposed outside the first partition wall; a first trench disposed inside the first partition wall and having a first width; a second trench disposed between the first and second partition walls and having a second width greater than the first width; an alignment key disposed to overlap the second trench; a first spacer disposed on the alignment key; and a sealing member disposed along an edge between the first substrate and the second substrate without overlapping the alignment key, wherein the first spacer partially overlaps the first partition wall, the second partition wall, and the sealing member.

Another embodiment of a display device includes a second substrate disposed on the first substrate; a sealing member disposed along an edge of the first substrate between the first substrate and the second substrate; first and second partition walls disposed on the second substrate, the second partition wall being disposed to surround the first partition wall; an alignment key disposed between the first and second partition walls without overlapping the sealing member; and a first spacer disposed on the alignment key and partially overlapping the first partition wall and the second partition wall, wherein the sealing member is disposed over the first spacer and the second partition wall.

An embodiment of a method of fabricating a display device includes preparing a first substrate and a second substrate in which a display area, a dummy area disposed to surround the display area, and a sealing area disposed to surround the dummy area are defined; forming a first partition wall(s) in the dummy area of the second substrate, and forming a second partition wall in the sealing area of the second substrate; forming a first spacer in a trench defined by an outer side surface of the first partition wall, an upper surface of the second substrate, and an inner side surface of the second partition wall; disposing a sealing member over the second partition wall and the first spacer, the sealing member surrounding an edge of the second substrate; and bonding the first substrate to the second substrate, wherein the first spacer partially overlaps the first partition wall and the second partition wall.

According to the display device and the method of fabricating the display device in accordance with an embodiment, it may include a trench disposed in a non-display area and having an alignment key arranged therein. A spacer may be disposed inside the trench to overlap the alignment key. The spacer may include a transparent material so that the alignment key is easily visualized from the front surface of the substrate, thereby facilitating substrate bonding.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

Hereinafter, embodiments will be described in detail with reference to the accompanying drawings.

Figure 1:
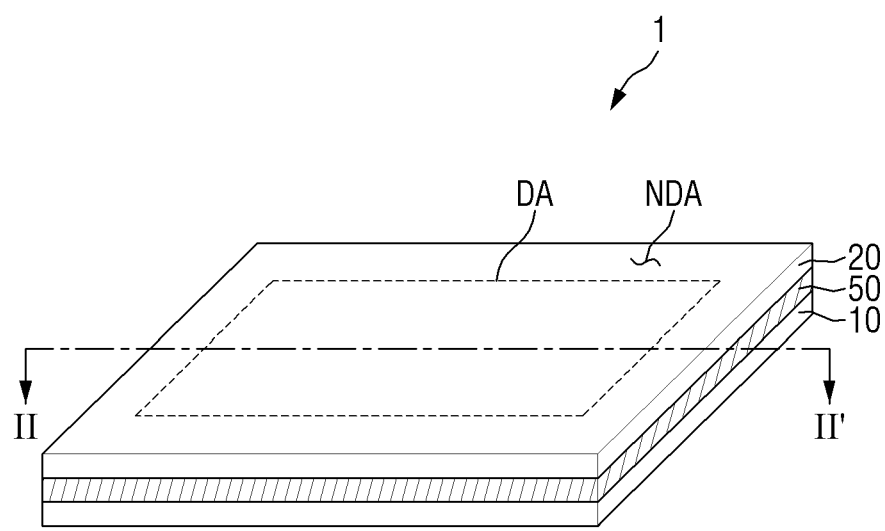
FIG. 1 is a perspective view of a display device according to an embodiment.

FIG. 1 is a perspective view of a display device according to an embodiment.

Referring to FIG. 1, a display device 1 may refer to any electronic device providing a display screen. Examples of the display device 1 may include a television, a laptop computer, a monitor, a billboard, a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, an Internet-of-Things device and the like, which provide a display screen.

The display device 1 illustrated in the drawing is a television (TV). The display device 1 may have a high resolution or an ultra high resolution such as HD, UHD, 4K, and 8K, without being limited thereto.

The display device 1 may have a rectangular shape in a plan view. The planar shape of the display device 1 is not limited to the exemplified one, but may have a circular shape or other shapes.

The display device 1 may include a display area DA displaying an image and a non-display area NDA not displaying an image. The display area DA may include a plurality of pixels PX. The non-display area NDA may be located around the display area DA and may surround the display area DA. Details of the display area DA and the non-display area NDA will be described later with reference to FIGS. 3, 4, and 5.

Figure 2:
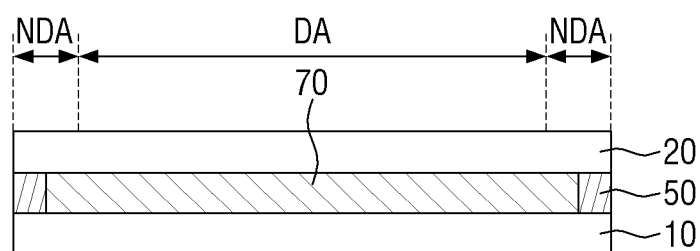
FIG. 2 is a cross-sectional view taken along line II-IT of FIG. 1.

FIG. 2 is a schematic cross-sectional view taken along line II-II' of FIG. 1.

Referring to FIG. 2, the display device 1 may include a first substrate 10 and a second substrate 20 facing the first substrate 10. The display device 1 may further include a sealing member 50 that bonds the first substrate 10 to the second substrate 20, and a filling layer 70 filled between the first substrate 10 and the second substrate 20.

The first substrate 10 may include elements and circuits for displaying an image, for example, a pixel circuit such as a switching element, a pixel defining layer PDL (see FIG. 4) that defines an emission region and a non-emission region, and a self-light emitting element. In an example embodiment, the self-light emitting element may include at least one of an organic light emitting diode, a quantum dot light emitting diode, an inorganic micro light emitting diode (e.g., micro LED), or an inorganic nano light emitting diode (e.g., nano LED). Hereinafter, a case where the self-light emitting element is an organic light emitting diode will be described by way of example.

The second substrate 20 may be disposed on the first substrate 10 and may face the first substrate 10. The second substrate 20 may include a color control structure that converts the color of incident light. The color control structure may control the wavelength of incident light, thereby converting the color of incident light.

The sealing member 50 may be positioned between the first substrate 10 and the second substrate 20 in the non-display area NDA. The sealing member 50 may be disposed along the edges of the first substrate 10 and the second substrate 20 in the non-display area NDA, and may surround the display area DA in a plan view.

The filling layer 70 may be disposed in a space between the first substrate 10 and the second substrate 20 surrounded by the sealing member 50. The filling layer 70 may fill the space between the first substrate 10 and the second substrate 20.

Figure 3:
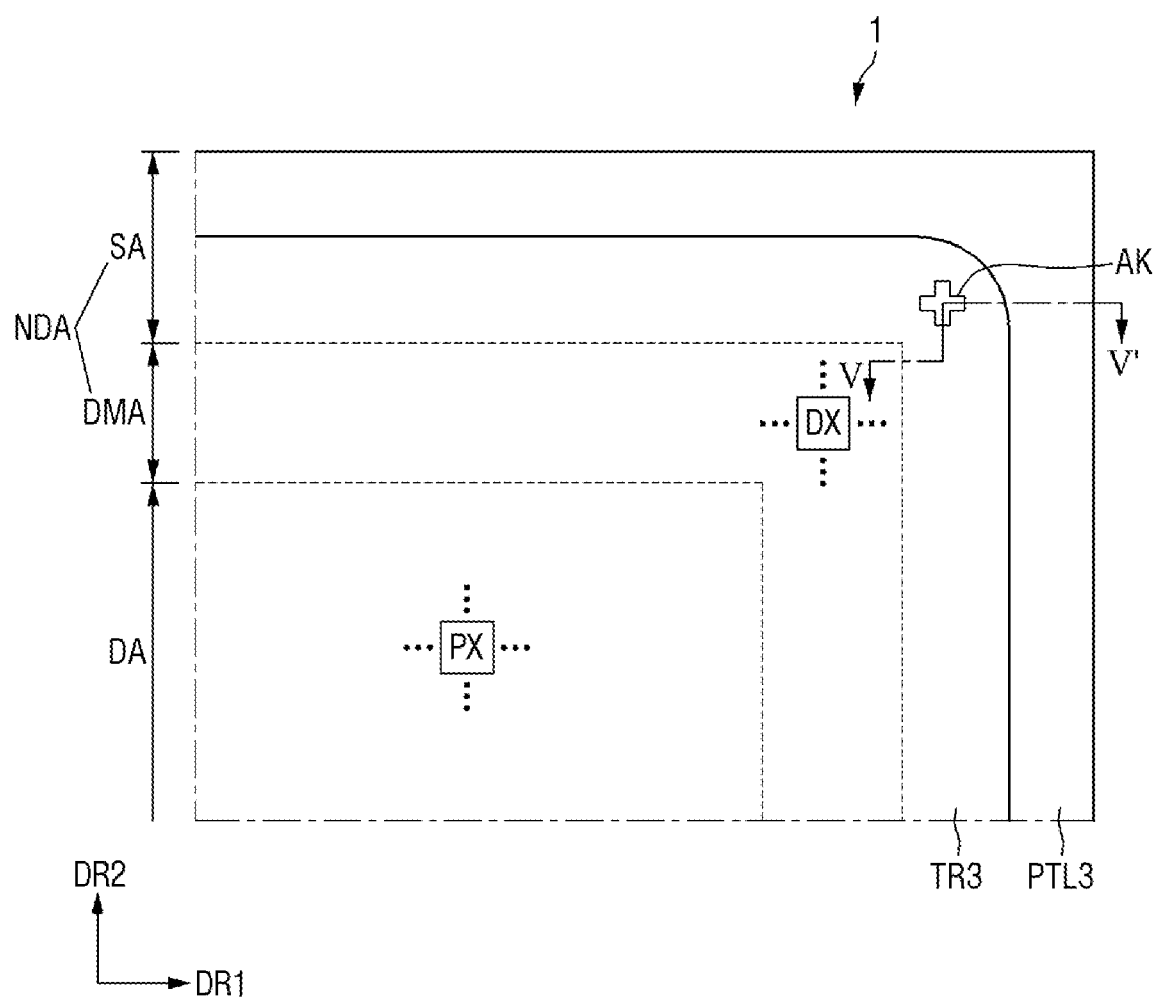
FIG. 3 is a plan view illustrating a part of the display device of FIG. 1.
Figure 4:
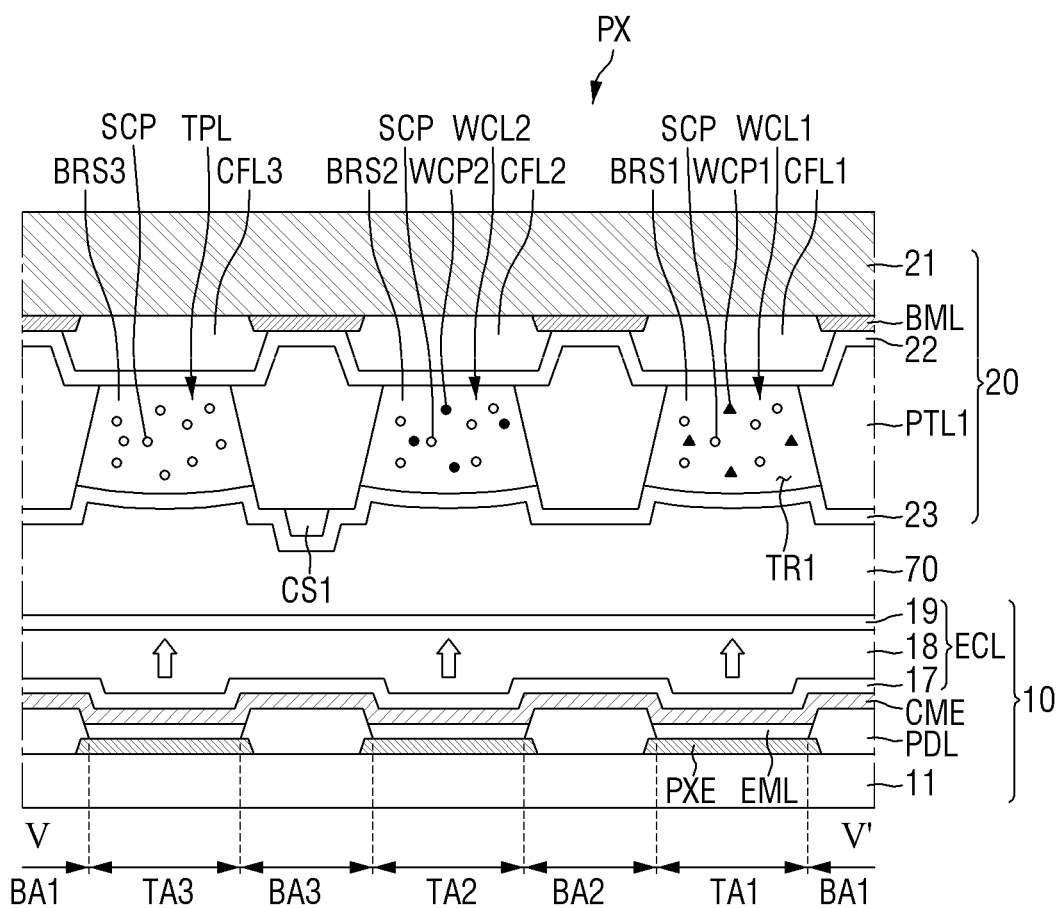
FIG. 4 is a partial cross-sectional view of the display area of FIG. 3.
Figure 5:
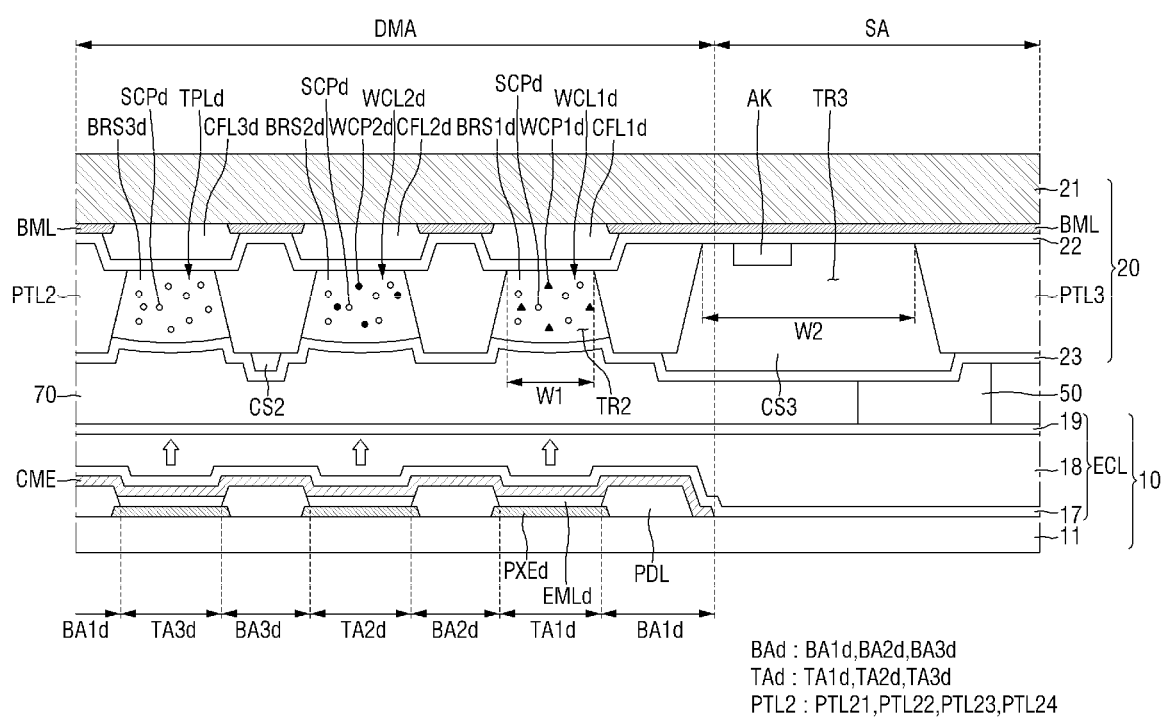
FIG. 5 is a cross-sectional view taken along line V-V' of FIG. 3.

FIG. 3 is a plan view illustrating a part of the display device of FIG. 1. FIG. 4 is a partial cross-sectional view of the display area of FIG. 3. FIG. 5 is a cross-sectional view taken along line V-V' of FIG. 3. FIG. 5 is a cross-sectional view of a part of a dummy area and a sealing area of a display device.

Referring to FIGS. 3, 4, and 5, the display area DA and the non-display area NDA may be defined in the display device 1 as described above. The display area DA may include a plurality of pixels PX and substantially contribute to image display. As used herein, the term "pixel" may mean a single area defined by dividing the display area DA for image display or color display in a plan view, and one pixel may display a predetermined base color. That is, one pixel may be a minimum unit area capable of displaying a color independently of the other pixels. Examples of the base color may include red, green, and blue, but the present disclosure is not limited thereto.

Each of the plurality of pixels PX may display different colors. In an example embodiment, the plurality of pixels PX may include a first pixel displaying a first color, a second pixel displaying a second color having a peak wavelength shorter than the first color, and a third pixel displaying a third color having a peak wavelength shorter than the second color. The first, second, and third pixels may form one repeating unit, and the repeating unit may be repeatedly arranged in a first direction DR1. Each of the first to third pixels may also be repeated in a second direction DR2, so that the plurality of pixels PX may be arranged in a matrix in a plan view.

The non-display area NDA may be disposed around the display area DA. The non-display area NDA may completely or partially surround the display area DA. The non-display area NDA may not contribute to image display unlike the display area DA. The non-display area NDA may form a bezel of the display device 1. In the non-display area NDA, components (e.g., a connection pad, a driving circuit, etc.) required for driving the display device 1 may be disposed.

The non-display area NDA may include a sealing area SA where the sealing member 50 is disposed and a dummy area DMA which is positioned on the inside (i.e., on the display area DA side) in comparison with the sealing area SA. The display area DA may be surrounded by the dummy area DMA. Further, the dummy area DMA may be surrounded by the sealing area SA.

The dummy area DMA may include a plurality of dummy pixels DX. The dummy pixels DX disposed in the dummy area DMA do not contribute to image display, but may include dummy pixel electrodes PXEd.

In the display area DA, the display device 1 may include a first base substrate 11, a pixel electrode PXE disposed for each pixel PX of the first base substrate 11, a pixel defining layer PDL disposed along the boundaries of the pixels PX of the first base substrate 11, a light emitting layer EML disposed on the pixel electrode PXE in an opening exposed by the pixel defining layer PDL, a common electrode CME disposed on the light emitting layer EML and the pixel defining layer PDL across the plurality of pixels PX, and an encapsulation structure ECL disposed on the common electrode CME.

The pixel defining layer PDL may overlap an edge portion of the pixel electrode PXE. The light emitting layer EML may include an organic light emitting material. The organic light emitting material of the light emitting layer EML may emit the same color regardless of the color pixel PX. For example, the light emitting layer EML may emit blue light from all of the red, green, and blue pixels PX. However, the embodiment of the present disclosure is not limited thereto. The pixel defining layer PDL may include the openings exposing the pixel electrodes PXE. The pixel defining layer PDL may be disposed on the first base substrate 11 across the display area DA and the dummy area DMA which will be described later, but is not limited thereto.

The encapsulation structure ECL may include at least one thin film encapsulation layer. The encapsulation structure ECL may be entirely disposed above the first base substrate 11 over the display area DA, and the dummy area DMA and the sealing area SA which will be described later. The encapsulation structure ECL may function to protect members disposed on the first base substrate 11 against the external environment. For example, the thin film encapsulation layer may include a first inorganic layer 17, an organic layer 18, and a second inorganic layer 19. The first and second inorganic layers 17 and 19 may include an insulating inorganic material, and the organic layer 18 may include an insulating organic material.

In the display area DA, the second substrate 20 may include a second base substrate 21, a light blocking member BML disposed on one surface of the second base substrate 21, which faces the first base substrate 11, a color filter layer CFL disposed on one surface of the second base substrate 21 in an opening defined by the light blocking member BML, a first capping layer 22 disposed on the color filter layer CFL, a first partition wall PTL1 disposed on the first capping layer 22 to overlap the light blocking member BML, a first trench TR1 that is defined as a space surrounded by the first partition walls PTL1, a wavelength conversion layer WCL and a light transmitting layer TPL disposed in the first trenches TR1, and a first spacer CS1 disposed on at least a partial area of the first partition wall PTL1. In addition, in the display area DA, the second substrate 20 may further include a second capping layer 23 that covers the first partition wall PTL1, the wavelength conversion layer WCL, the light transmitting layer TPL, and the first spacer CS1.

The light blocking member BML may be disposed in a light blocking area BA to overlap the pixel defining layer PDL, and include the openings that expose one surface of the second base substrate 21 while overlapping light transmitting areas TA. The light blocking member BML may be disposed on the second base substrate 21 across the dummy area DMA and the sealing area SA, which will be described later, as well as the display area DA.

The color filter layer CFL may include a first color filter layer CFL1 disposed in the first color pixel PX, a second color filter layer CFL2 disposed in the second color pixel PX, and a third color filter layer CFL3 disposed in the third color pixel PX. For example, the first color filter layer CFL1 may be a red color filter layer, the second color filter layer CFL2 may be a green color filter layer, and the third color filter layer CFL3 may be a blue color filter layer.

The first capping layer 22 may cover the light blocking member BML and the color filter layer CFL. The first capping layer 22 may be disposed above the second base substrate 21 across the dummy area DMA and the sealing area SA, which will be described later, as well as the display area DA.

The first partition wall PTL1 may include the plurality of first trenches TR1 penetrating the first partition wall PTL1 in the thickness direction. The first trenches TR1 may be disposed to be spaced apart from each other. The first partition wall PTL1 may be integrally formed with a second partition wall PTL2 which will be described later, but is not limited thereto.

The wavelength conversion layer WCL may include a first wavelength conversion pattern WCL1 disposed in the first color pixel PX and a second wavelength conversion pattern WCL2 disposed in the second color pixel PX. The light transmitting layer TPL may be disposed in the third color pixel PX.

The first wavelength conversion pattern WCL1 may include a first base resin BRS1, and a first wavelength conversion material WCP1 and scatterers SCP provided in the first base resin BRS1. The second wavelength conversion pattern WCL2 may include a second base resin BRS2, and a second wavelength conversion material WCP2 and scatterers SCP provided in the second base resin BRS2. The light transmitting layer TPL may include a third base resin BRS3 and scatterers SCP provided in the third base resin BRS3.

The first, second, and third base resins BRS1, BRS2, and BRS3 may include a light-transmitting organic material. For example, the first, second, and third base resins BRS1, BRS2, and BRS3 may include an epoxy resin, an acrylic resin, a cardo resin, an imide resin or the like. The first, second, and third base resins BRS1, BRS2 and BRS3 may be formed of the same material, but the present disclosure is not limited thereto.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first wavelength conversion material WCP1 may convert the third color into the first color, and the second wavelength conversion material WCP2 may convert the third color into the second color. The first wavelength conversion material WCP1 and the second wavelength conversion material WCP2 may be quantum dots, quantum bars, phosphors or the like. Examples of the quantum dots may include group IV nanocrystals, group II-VI compound nanocrystals, group III-V compound nanocrystals, group IV-VI nanocrystals, and combinations thereof. The first wavelength conversion pattern WCL1 and the second wavelength conversion pattern WCL2 may further include scatterers SCP for increasing wavelength conversion efficiency.

The light transmitting layer TPL disposed in the third color pixel PX transmits light of the third color emitted from the light emitting layer EML while maintaining the wavelength of the light. The scatterers SCP of the light transmitting layer TPL may serve to control an emission path of the light emitted through the light transmitting layer TPL. The light transmitting layer TPL may not include a wavelength conversion material.

The first spacer CS1 may be disposed on the partial area of the first partition wall PTL1 and may also be disposed in the light blocking area BA. The first spacer CS1 may serve to maintain the distance between the first substrate 10 and the second substrate 20 in the display area DA. The first spacer CS1 may be formed through an exposure and development process. For example, the first spacer CS1 may include an organic material, and the organic material may be a photosensitive organic material. In this case, the first spacer CS1 may be formed by applying an organic material layer for spacers and then exposing and developing it. The organic material layer for spacers may be a negative photosensitive material which is cured at a portion irradiated with light, but is not limited thereto. The first spacer CS1 may be made of a transparent material.

The filling layer 70 may be disposed between the first substrate 10 and the second substrate 20. The filling layer 70 may fill a space between the first substrate 10 and the second substrate 20, and may serve to bond them to each other. The filling layer 70 may be disposed between the encapsulation structure ECL of the first substrate 10 and the second capping layer 23 of the second substrate 20.

In the dummy area DMA, the first substrate 10 may include the first base substrate 11, the dummy pixel electrode PXEd disposed for each dummy pixel DX of the first base substrate 11, the pixel defining layer PDL disposed along the boundaries of the dummy pixels DX of the first base substrate 11, a dummy light emitting layer EMLd disposed on the dummy pixel electrode PXEd in the opening exposed by the pixel defining layer PDL, the common electrode CME disposed on the dummy light emitting layer EMLd and the pixel defining layer PDL across the plurality of dummy pixels DX, and the encapsulation structure ECL disposed on the common electrode CME. In the non-display area NDA, the dummy area DMA and the sealing area SA may be distinguished by an imaginary line perpendicular to the edge of the common electrode CME. For example, the dummy area DMA and the sealing area SA may be respectively disposed on one side and the other side with respect to the imaginary line perpendicular to the edge of the common electrode CME.

Descriptions of the dummy pixel electrode PXEd, the pixel defining layer PDL, the dummy light emitting layer EMLd, and the common electrode CME disposed in the dummy area DMA are respectively the same as those of the pixel electrode PXE, the pixel defining layer PDL, the light emitting layer EML and the common electrode CME disposed in the display area DA. In the dummy area DMA, the first substrate 10 may include all of the dummy pixel electrode PXEd, the pixel defining layer PDL, the dummy light emitting layer EMLd, and the common electrode CME, but is not limited thereto and some of them may be omitted.

In the dummy area DMA, the second substrate 20 may include the second base substrate 21, the light blocking member BML disposed on one surface of the second base substrate 21, which faces the first base substrate 11, a dummy color filter layer CFLd disposed on one surface of the second base substrate 21 in the opening defined by the light blocking member BML, the first capping layer 22 disposed on the dummy color filter layer CFLd, the second partition wall PTL2 disposed on the first capping layer 22 to overlap the light blocking member BML, a second trench TR2 that is defined as a space surrounded by the second partition walls PTL2, a dummy wavelength conversion layer WCL1d and WCL2d, and a dummy light transmitting layer TPLd disposed in the second trenches TR2, and a second spacer CS2 disposed on at least a part of the second partition wall PTL2. The second substrate 20 may further include the second capping layer 23 disposed on the dummy wavelength conversion layer WCL1d and WCL2d, the dummy light transmitting layer TPLd, the second partition wall PTL2, and the second spacer CS2.

The light blocking member BML may be disposed in a light blocking area BAd to overlap the pixel defining layer PDL, and include the openings that expose one surface of the second base substrate 21 while overlapping light transmitting areas TAd.

The dummy color filter layer CFLd may include a first dummy color filter layer CFL1d, a second dummy color filter layer CFL2d, and a third dummy color filter layer CFL3d. Descriptions of the first to third dummy color filter layers CFL1d, CFL2d, and CFL3d are the same as those of the first, second, and third color filter layers CFL1, CFL2, and CFL3 described above and thus will be omitted.

The second partition wall PTL2 may include the plurality of second trenches TR2 penetrating the second partition wall PTL2 in the thickness direction. The second trenches TR2 may be disposed to be spaced apart from each other. Each of the second trenches TR2 may have a first width W1. As described above, the second partition wall PTL2 may be integrally formed with the first partition wall PTL1, but is not limited thereto. The upper surface of the second partition wall PTL2 may be positioned on the same plane as the upper surface of the first partition wall PTL1.

The dummy wavelength conversion layer WCL1d and WCL2d may include a first dummy wavelength conversion pattern WCL1d disposed in the first color dummy pixel DX and a second dummy wavelength conversion pattern WCL2d disposed in the second color dummy pixel DX. The dummy light transmitting layer TPLd may be disposed in the third color dummy pixel DX.

Descriptions of the dummy wavelength conversion layer WCL1d and WCL2d, and the dummy light transmitting layer TPLd of the dummy area DMA are the same as those of the wavelength conversion layer WCL and the light transmitting layer TPL of the display area DA described above and thus will be omitted. In the dummy area DMA, the second substrate 20 may include all of the light blocking member BML, the dummy color filter layer CFLd, the second partition wall PTL2, the dummy wavelength conversion layer WCL1d and WCL2d, the dummy light transmitting layer TPLd, and the second spacer CS2, but is not limited thereto and some of them may be omitted.

The second spacer CS2 may be disposed on the second partition wall PTL2 and may also be disposed in the light blocking area BAd. The second spacer CS2 may serve to maintain the distance between the first substrate 10 and the second substrate 20 in the dummy area DMA. Other details of the second spacer CS2 are the same as those of the first spacer CS1 described above and thus will be omitted.

The sealing area SA may be disposed outside the dummy area DMA. In the sealing area SA, the first substrate 10 may include the first base substrate 11 and the encapsulation structure ECL disposed on the first base substrate 11. The encapsulation structure ECL disposed in the sealing area SA may include the first inorganic layer 17, the organic layer 18, and the second inorganic layer 19, similarly to the encapsulation structures ECL disposed in the display area DA and the dummy area DMA.

In the sealing area SA, the second substrate 20 may include the second base substrate 21, the light blocking member BML disposed on one surface of the second base substrate 21, which faces the first base substrate 11, the first capping layer 22 disposed on the light blocking member BML, a third partition wall PTL3 disposed on the first capping layer 22 to overlap the light blocking member BML, a third trench TR3 defined by the outer side surface of the outermost second partition wall PTL2, the inner side surface of the third partition wall PTL3, and the upper surface of the first capping layer 22, and a third spacer CS3 disposed in the third trench TR3. Further, in the sealing area SA, the second substrate 20 may further include the second capping layer 23 which covers the third partition wall PTL3 and the third spacer CS3.

The display device 1 according to an embodiment may include the third trench TR3 that is a space defined by the outer side surface of the outermost second partition wall PTL2, the inner side surface of the third partition wall PTL3, and the upper surface of the first capping layer 22. The third trench TR3 may be disposed in the non-display area NDA. In one embodiment, the third trench TR3 may be disposed across the dummy area DMA and the sealing area SA, but is not limited thereto. The third trench TR3 may have a second width W2 greater than the first width W1 of the second trench TR2.

The third trench TR3 may partially expose the first capping layer 22. The third spacer CS3 may be disposed in the third trench TR3. The third spacer CS3 may serve to maintain the distance between the first substrate 10 and the second substrate 20 in the sealing area SA. The third spacer CS3 may be made of the same material as the first and second spacers CS1 and CS2, and may be formed together, but is not limited thereto.

The third spacer CS3 may partially overlap the outermost second partition wall PTL2 and the third partition wall PTL3. The third spacer CS3 may be disposed to partially cover the upper surface of the outermost second partition wall PTL2 and the upper surface of the third partition wall PTL3. A flat region may be provided between a region of the third spacer CS3, which overlaps the outermost second partition wall PTL2, and a region of the third spacer CS3, which overlaps the third partition wall PTL3. The regions of the third spacer CS3 overlapping the outermost second partition wall PTL2 and the third partition wall PTL3 may have protruding shapes in comparison to the flat region, but are not limited thereto.

The display device 1 according to an embodiment may further include an alignment key AK disposed inside the third trench TR3. The alignment key AK may be disposed to align the first substrate 10 and the second substrate 20 when bonding them. The alignment key AK may be arranged to overlap the third trench TR3. The alignment key AK may include, for example, an organic material or an inorganic material, but is not limited thereto. The alignment key AK may be patterned in a cross shape, but is not limited thereto.

In the sealing area SA, the sealing member 50 may be disposed between the first substrate 10 and the second substrate 20. The first substrate 10 and the second substrate 20 may be bonded to each other via the sealing member 50. The sealing member 50 may include an organic material. The sealing member 50 may be made of an epoxy resin, but is not limited thereto. The sealing member 50 may be disposed over the third spacer CS3 and the third partition wall PTL3. The sealing member 50 may partially overlap the third spacer CS3 and the third partition wall PTL3. The sealing member 50 may be disposed outside the alignment key AK without overlapping the alignment key AK. The filling layer 70 may be disposed inside the sealing member 50.

In the display device 1 according to an embodiment, the dummy area DMA including the dummy pixels DX may be disposed outside the display area DA in order to prevent the display quality of the display device 1 from being deteriorated due to a residue phenomenon occurring in a space between the first partition walls PTL1 in the display area DA.

Further, the second substrate 20 may include the alignment key AK to align the first substrate 10 and the second substrate 20 when bonding them. When the alignment key AK is disposed in the dummy area DMA, it may be difficult to visually recognize the alignment key AK from the front surface of the second substrate 20 due to the dummy pixels DX.

The second substrate 20 included in the display device 1 according to an embodiment may have the third trench TR3 disposed in the non-display area NDA, and the alignment key AK may be disposed in the third trench TR3. Further, the third spacer CS3 may be arranged in the third trench TR3 to overlap the alignment key AK. The third spacer CS3 may include a transparent material so that the alignment key AK can be easily visualized from the front surface of the second substrate 20.

Hereinafter, a method of fabricating the display device 1 will be described.

FIGS. 6, 7, 8, 9, 10, and 11 are schematic views illustrating a method of fabricating a display device according to an embodiment. FIGS. 6, 7, 8, 9, 10, and 11 illustrate the non-display area NDA in the fabricating process of the second substrate 20. FIGS. 6, 7, 8, 9, 10, and 11 illustrate the second substrate 20 of FIGS. 4 and 5 in an upside-down state for convenience of description.

Figure 6:
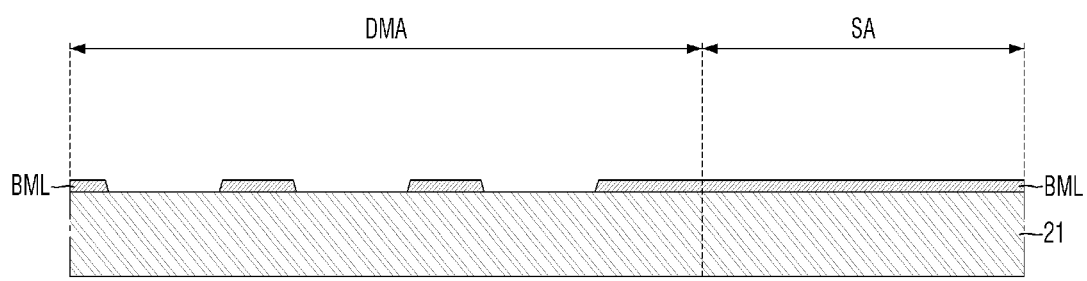
FIGS. 6, 7, 8, 9, 10, and 11 are schematic views illustrating a method of fabricating a display device according to an embodiment.

Referring to FIG. 6, light blocking members BML are formed on one surface of the second base substrate 21 of the second substrate 20. The light blocking members BML may be formed by applying a light blocking material containing a material for blocking light, and then exposing and developing it. The light blocking members BML may be formed together in one process. A patterned light blocking member BML may partially expose the second base substrate 21.

Figure 7:
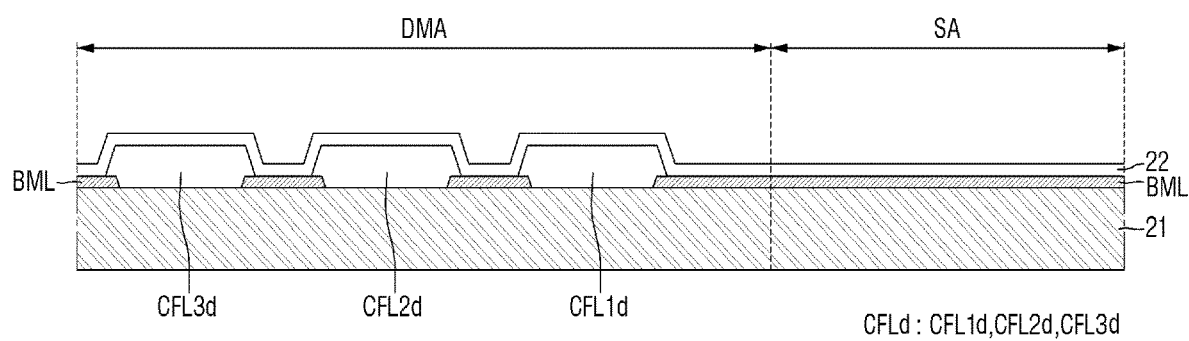

Referring to FIG. 7, the dummy color filter layer CFLd may be formed between the light blocking members BML exposing the second base substrate 21. Specifically, the dummy color filter layer CFLd may include the first dummy color filter layer CFL1d, the second dummy color filter layer CFL2d, and the third dummy color filter layer CFL3d. The first, second, and third dummy color filter layers CFL1d, CFL2d, and CFL3d of the dummy color filter layer CFLd may be formed by applying a photosensitive organic material containing a color material of a specific color and then exposing and developing it. The first, second, and third dummy color filter layers CFL1d, CFL2d, and CFL3d may be formed in the order of the third dummy color filter layer CFL3d, the first dummy color filter layer CFL1d, and the second dummy color filter layer CFL2d, but the present disclosure is not limited thereto.

Subsequently, the first capping layer 22 may be formed on a patterned dummy color filter layer CFLd to cover it. The first capping layer 22 may be disposed over the entire surface of the second base substrate 21.

Figure 8:
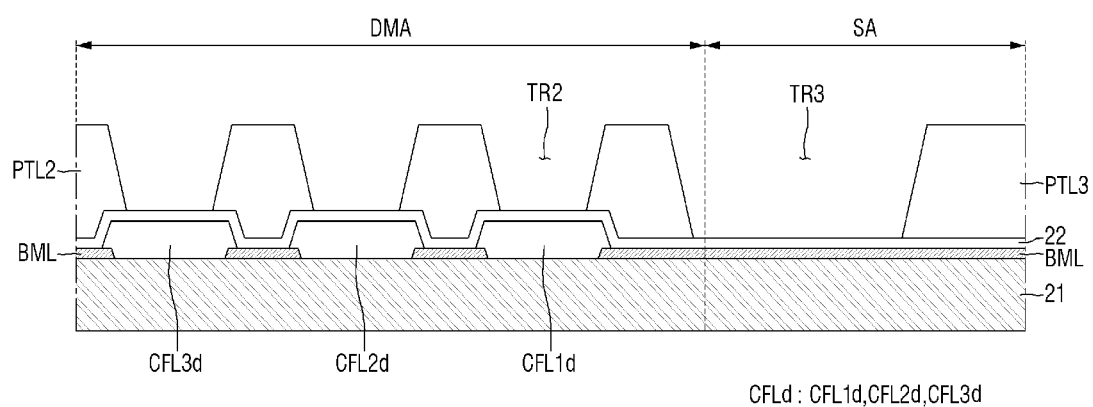

Subsequently, referring to FIG. 8, the second and third partition walls PTL2 and PTL3 may be formed on the first capping layer 22. Specifically, patterned second and third partition walls PTL2 and PTL3 may be formed on the first capping layer 22. The second and third partition walls PTL2 and PTL3 may be formed together in one process. The second and third partition walls PTL2 and PTL3 may be arranged above the light blocking member BML. The patterned second and third partition walls PTL2 and PTL3 may be formed through an exposure and development process. For example, the second and third partition walls PTL2 and PTL3 may include an organic material which may be a photosensitive organic material. In this case, the patterned second and third partition walls PTL2 and PTL3 may be formed by applying an organic material layer for partition walls and then exposing and developing it. The organic material layer for partition walls may be a negative photosensitive material which is cured at a portion irradiated with light, but is not limited thereto.

Figure 9:
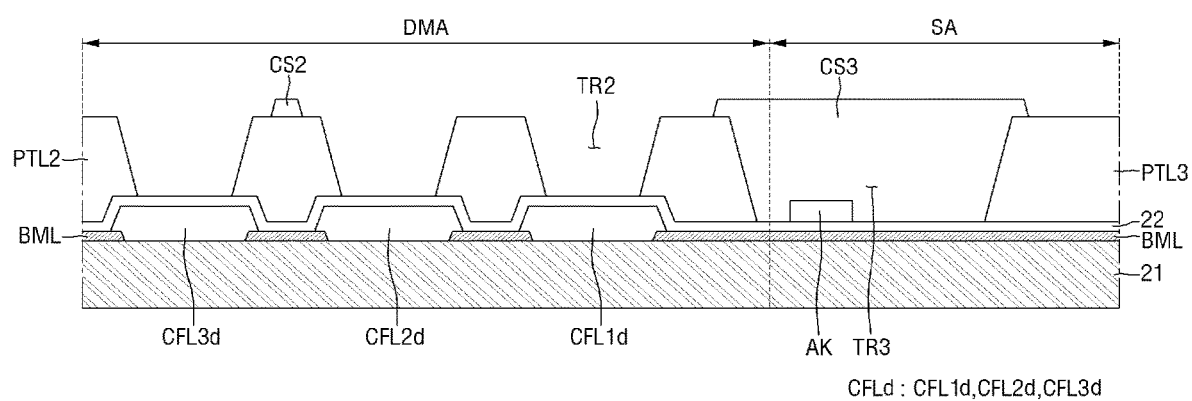

Referring to FIG. 9, the second spacer CS2 may be formed on the upper surface of the partial area of the patterned second partition wall PTL2, and the third spacer CS3 may be formed in the third trench TR3 defined by the outer side surface of the outermost second partition wall PTL2, the inner side surface of the third partition wall PTL3, and the upper surface of the first capping layer 22. The second and third spacers CS2 and CS3 may be formed together in one process. The second and third spacers CS2 and CS3 may be formed by applying an organic material layer for spacers and then exposing and developing it. The organic material layer for spacers may be a negative photosensitive material which is cured at a portion irradiated with light, but is not limited thereto. The organic material layer for spacers may be made of a transparent material, but is not limited thereto. The organic material layer for spacers may be made of a semi-transparent material.

Figure 10:
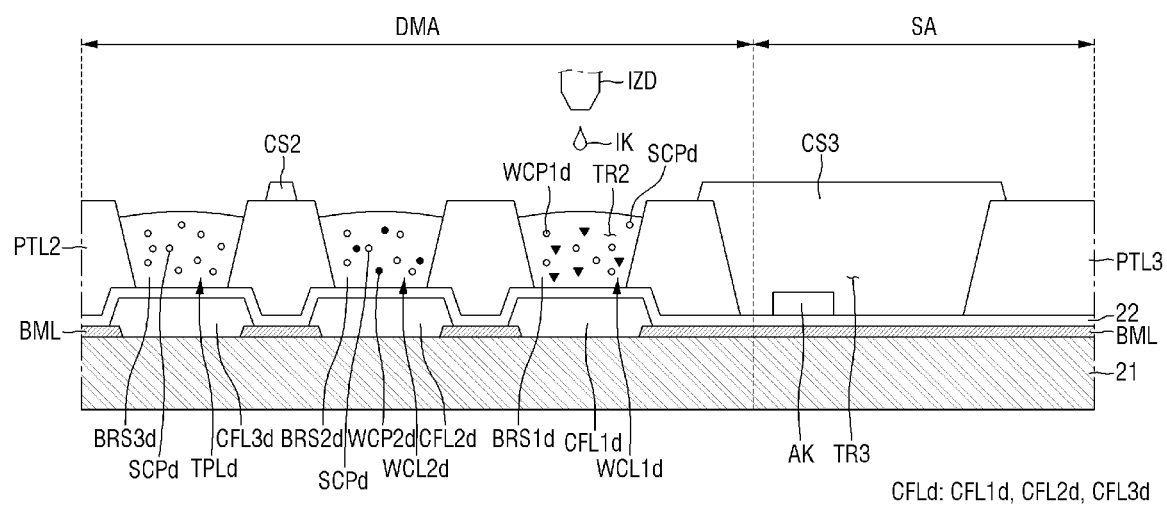

Referring to FIG. 10, dummy wavelength control layers WCL1d, WCL2d and TPLd may be formed in the second trenches TR2. The dummy wavelength control layers WCL1d, WCL2d and TPLd may be formed through an inkjet printing process using an inkjet device IZD. Specifically, the first dummy wavelength conversion pattern WCL1d (see also FIG. 11) may be formed by ejecting ink IK, which contains a material included in the first dummy wavelength conversion pattern WCL1d, toward a first light transmitting area TA1d (see FIG. 5). The ink IK may be injected from the area overlapping the first light transmitting area TA1d into the second trench TR2 defined by the second partition wall PTL2. That is, the second partition wall PTL2 may serve to stably guide the ink IK to a desired position to form the first dummy wavelength conversion pattern WCL1d.

Similarly, the second dummy wavelength conversion pattern WCL2d may be formed by ejecting ink IK, which contains a material included in the second dummy wavelength conversion pattern WCL2d, toward a second light transmitting area TA2d (see FIG. 5). The ink IK may be injected from the area overlapping the second light transmitting area TA2d into the second trench TR2 defined by the second partition wall PTL2. That is, the second partition wall PTL2 may serve to stably guide the ink IK to a desired position to form the second dummy wavelength conversion pattern WCL2d.

Similarly, the dummy light transmitting layer TPLd may be formed by ejecting ink IK, which contains a material included in the dummy light transmitting layer TPLd, toward a third light transmitting area TA3d (see FIG. 5). The ink IK may be injected from the area overlapping the third light transmitting area TA3d into the second trench TR2 defined by the second partition wall PTL2. That is, the second partition wall PTL2 may serve to stably guide the ink IK to a desired position to form the dummy light transmitting layer TPLd.

The injection amount of the ink IK may be determined in consideration of the surface tension and the volume shrinkage after drying the ink IK.

Figure 11:
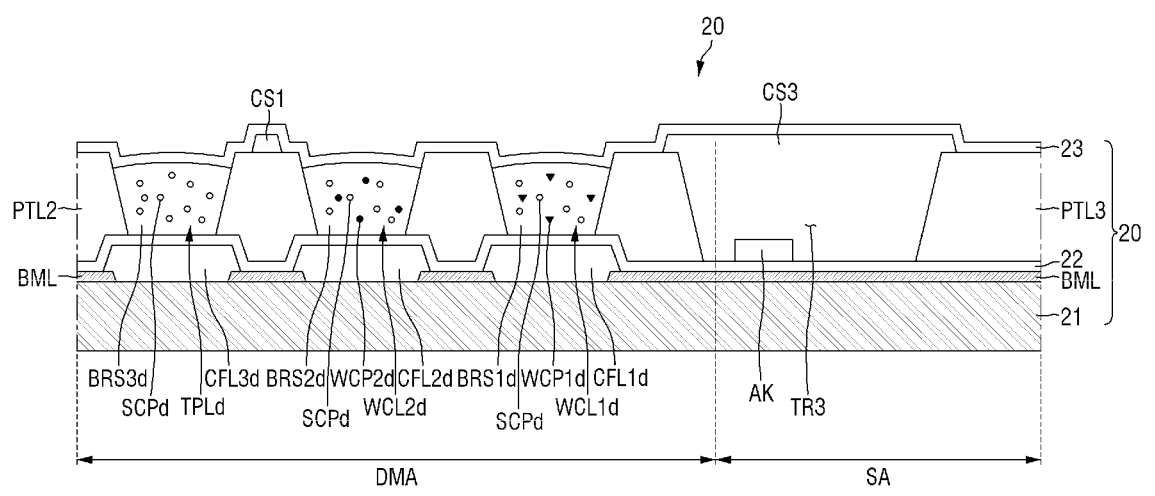

Referring to FIG. 11, the second capping layer 23 may be formed on the second partition wall PTL2, the third partition wall PTL3, the second spacer CS2, the third spacer CS3, and the dummy wavelength control layers WCL1d, WCL2d and TPLd. The second capping layer 23 may entirely cover the second partition wall PTL2, the third partition wall PTL3, the second spacer CS2, the third spacer CS3, and the dummy wavelength control layers WCL1d, WCL2d and TPLd. FIG. 11 illustrates that the second capping layer 23 is formed only in the dummy area DMA and the sealing area SA, but the present disclosure is not limited thereto. The second capping layer 23 may also be formed in the display area DA.

Thereafter, the filling layer 70 (see FIG. 5) may be coated on the second capping layer 23 and the spacer CS, and the first substrate 10 and the second substrate 20 may be bonded to each other. Since the above is a well-known fact, a detailed description thereof will be omitted.

According to the method of fabricating the display device 1 in accordance with an embodiment, the dummy area DMA including the dummy pixels DX may be disposed outside the display area DA in order to prevent the display quality of the display device 1 from being deteriorated due to the residue phenomenon occurring in a space between the first partition walls PTL1 in the display area DA.

Further, the second substrate 20 included in the display device 1 according to an embodiment may have the third trench TR3 disposed in the non-display area NDA, and the alignment key AK may be disposed in the third trench TR3. The third spacer CS3 may also be arranged in the third trench TR3 to overlap the alignment key AK. The third spacer CS3 may include a transparent material so that the alignment key AK is easily visualized from the front surface of the second substrate 20.

Hereinafter, other embodiments will be described. In the following embodiments, a description of the same components as those of the above-described embodiment will be omitted or simplified, and differences will be mainly described.

Figure 12:
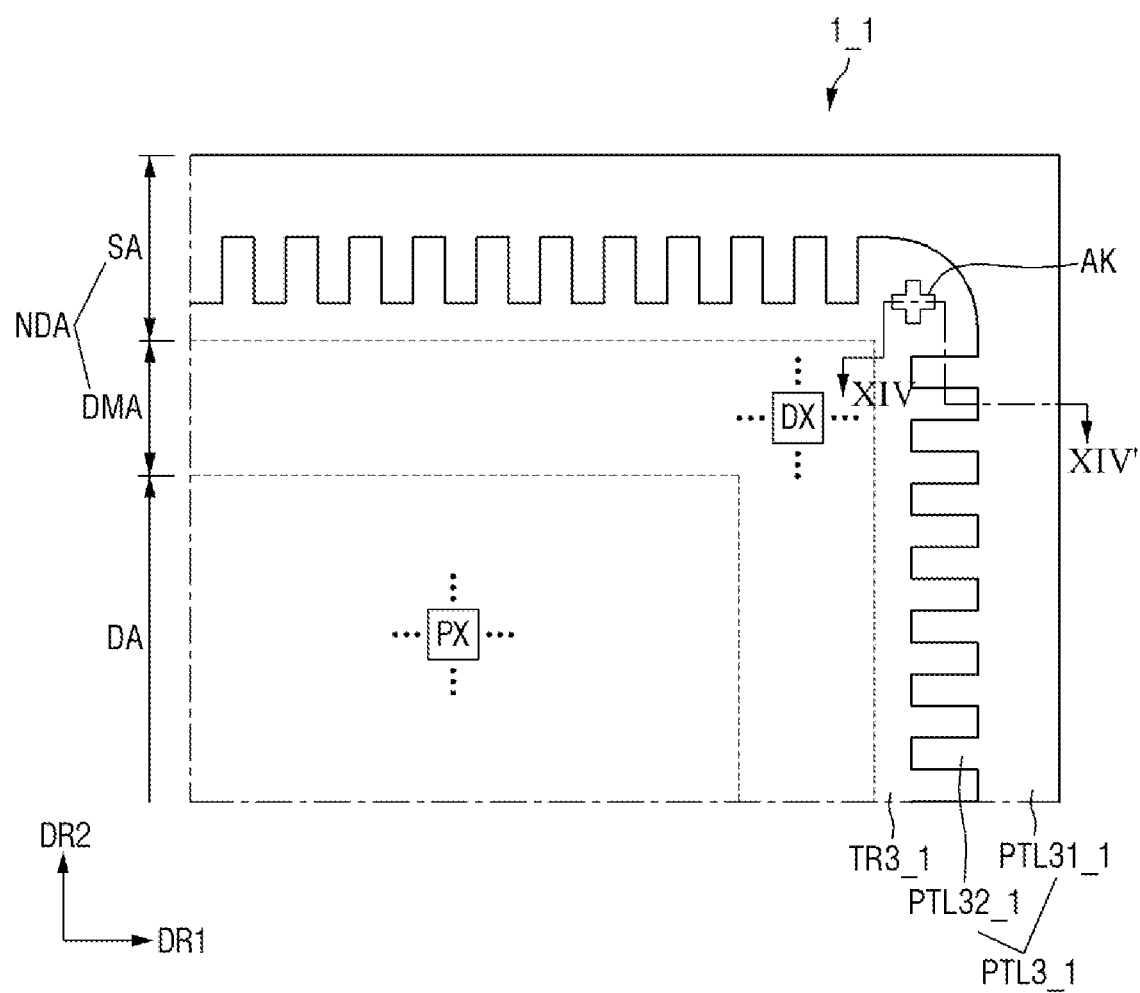
FIG. 12 is a plan view of a display device according to another embodiment.
Figure 13:
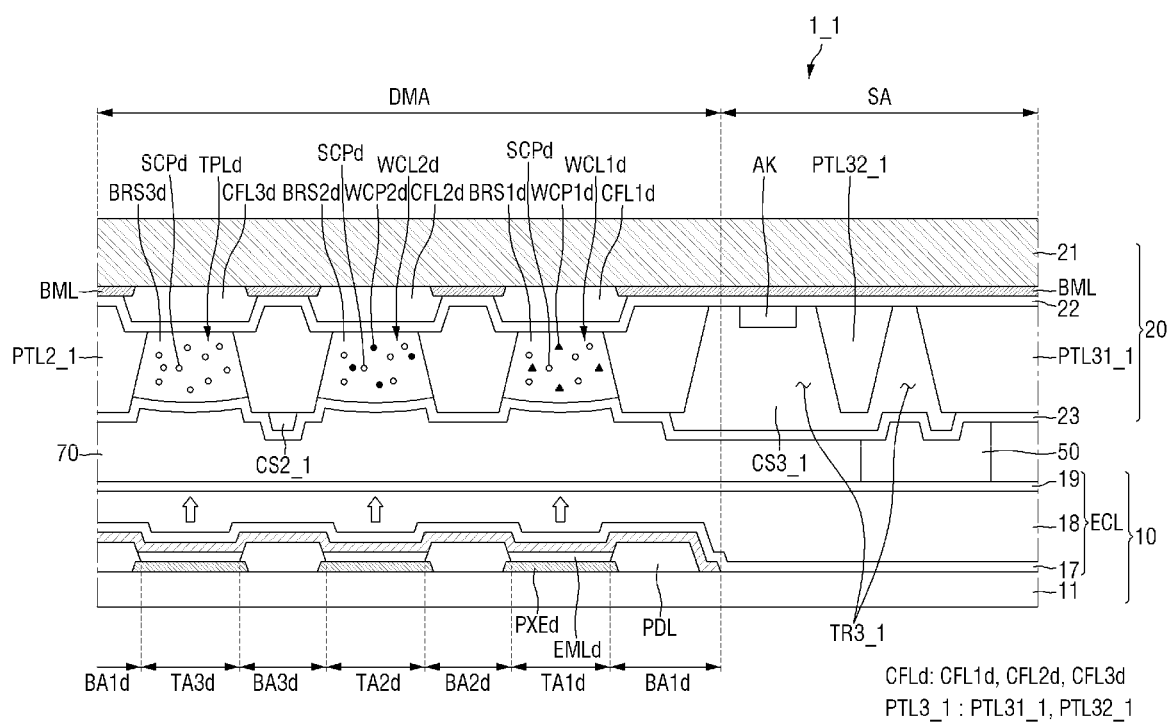
FIG. 13 is a cross-sectional view taken along line XIV-XIV' of FIG. 12.

FIG. 12 is a plan view of a display device according to another embodiment. FIG. 13 is a cross-sectional view taken along line XIV-XIV' of FIG. 12.

Referring to FIGS. 12 and 13, a third partition wall PTL3_1 included in a display device 1_1 according to the present embodiment may have a stem portion PTL31_1 formed along an outer line of the display device 1_1 and a branch portion PTL32_1 protruding inward from the stem portion PTL31_1.

Since the display device 1_1 according to the present embodiment is different from the display device 1 according to an embodiment in the structure of the third partition wall PTL3_1, a structure of a third trench TR3_1, which is defined by the inner side surface of the third partition wall PTL3_1, the upper surface of the first capping layer 22, and an outer side surface of an outermost second partition wall PTL2_1, may also be formed correspondingly.

In the third trench TR3_1, a third spacer CS3__1 may be disposed. The third spacer CS3_1 may cover a part of the outermost second partition wall PTL2_1, and a part of the stem portion PTL31_1 and the entire branch portion PTL32_1 of the third partition wall PTL3_1, but is not limited thereto.

The third partition wall PTL3_1 included in the display device 1_1 according to the present embodiment has the stem portion PTL31_1 and the branch portion PTL32_1 protruding inward from the stem portion PTL31_1, thereby effectively maintaining the height of the third spacer CS3_1.

The display device 1_1 according to the present embodiment may include the third trench TR3_1 disposed in the non-display area NDA, and having the alignment key AK arranged therein. The third spacer CS3_1 may be disposed in the third trench TR3_1 to overlap the alignment key AK. The third spacer CS3_1 may include a transparent material so that the alignment key AK is easily visualized from the front surface of the display device 1_1.

Figure 14:
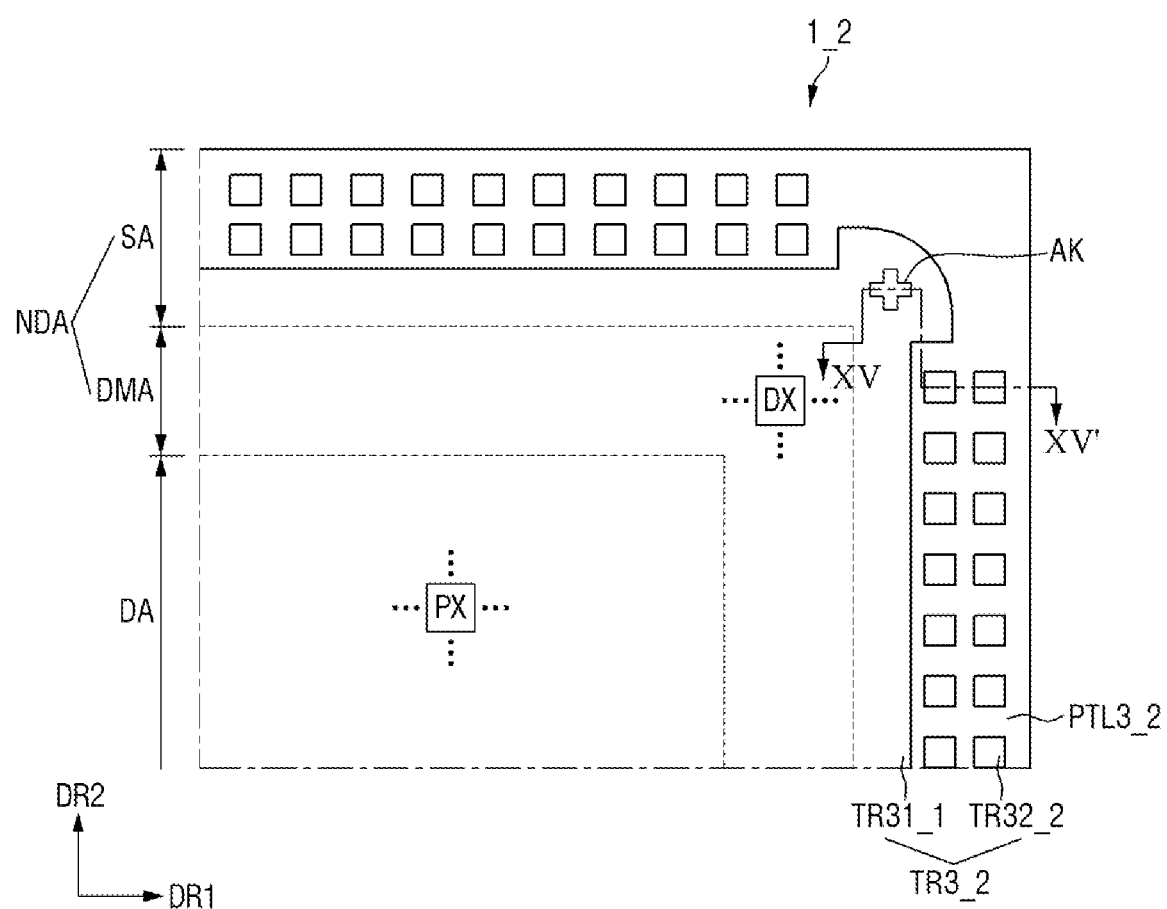
FIG. 14 is a plan view of a display device according to still another embodiment.
Figure 15:
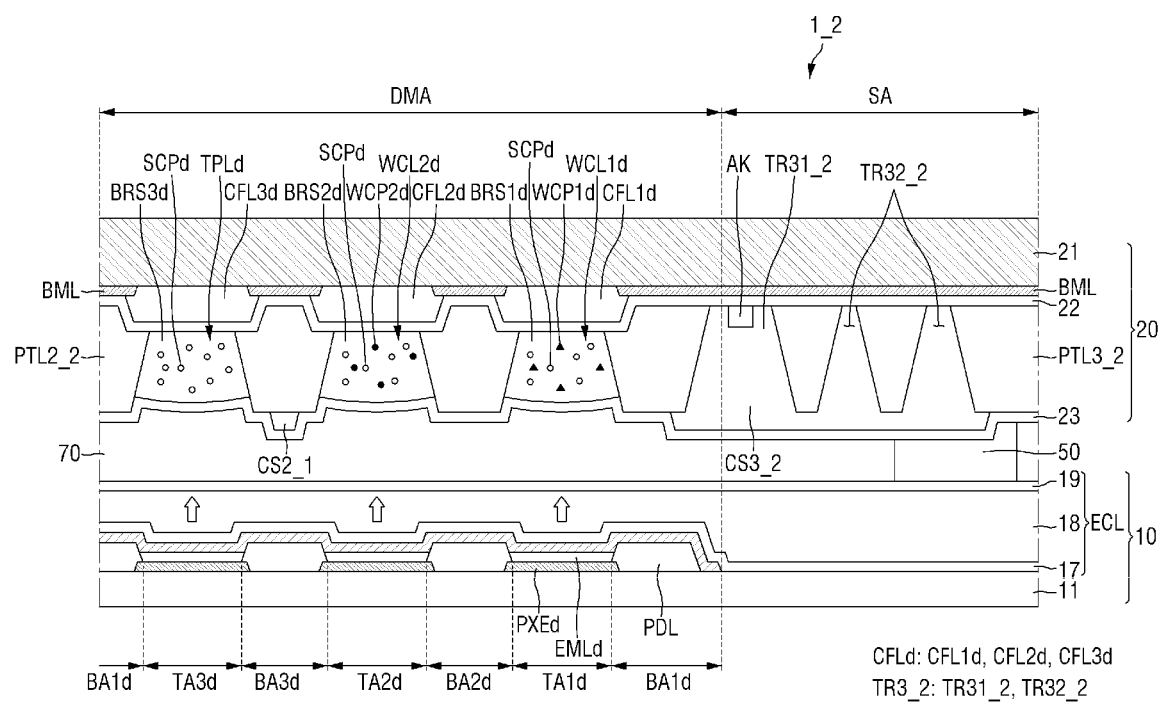
FIG. 15 is a cross-sectional view taken along line XV-XV' of FIG. 14.

FIG. 14 is a plan view of a display device according to still another embodiment. FIG. 15 is a cross-sectional view taken along line XV-XV' of FIG. 14.

Referring to FIGS. 14 and 15, a display device 1_2 according to the present embodiment may include a third partition wall PTL3_2 having a planar shape of a mesh structure. A third trench TR3_2 included in the display device 1_2 according to the present embodiment may have not only a third-a trench TR31_2 defined by an outer side surface of an outermost second partition wall PTL2_2, the upper surface of the first capping layer 22, and the inner side surface of the third partition wall PTL3_2, but also third-b trenches TR32_2 disposed in the third partition wall PTL3_2.

The third-b trenches TR32_2 may be arranged in a lattice shape in the third partition wall PTL3_2, but are not limited thereto. The third-b trenches TR32_2 may be arranged irregularly. The third-b trench TR32_2 may have a rectangular or square shape in a plan view, but is not limited thereto. The third-b trench TR32_2 may have a circular shape or another polygonal shape.

The third partition wall PTL3_2 included in the display device 1_2 according to the present embodiment has the planar shape of a mesh structure, thereby effectively maintaining the height of a third spacer CS3_2.

The display device 1_2 according to the present embodiment may include the third-a trench TR31_2 disposed in the non-display area NDA and having the alignment key AK arranged therein, and the third-b trenches TR32_2 disposed in the third partition wall PTL3_2. In the third trench TR3_2, the third spacer CS3_2 may be disposed to overlap the alignment key AK. The third spacer CS3_2 may include a transparent material so that the alignment key AK is easily visualized from the front surface of the display device 1_2.

Figure 16:
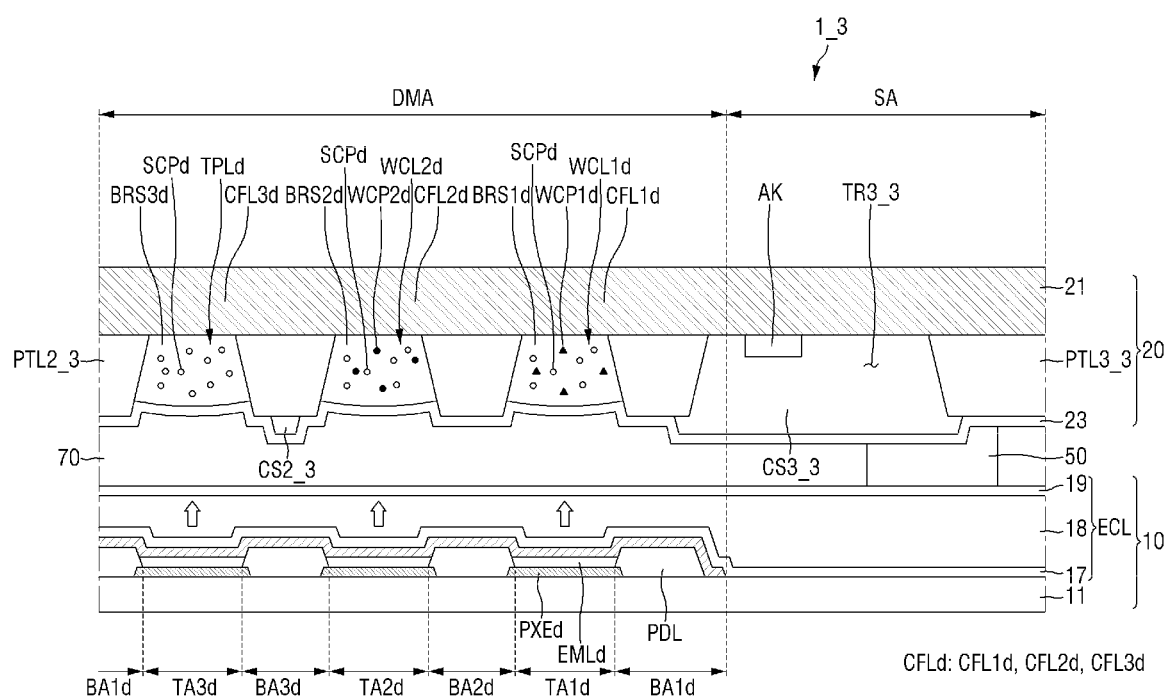
FIG. 16 is a cross-sectional view of a display device according to still another embodiment.

FIG. 16 is a cross-sectional view of a display device according to still another embodiment.

A display device 1_3 according to the present embodiment is different from the display device 1 according to an embodiment in that the light blocking members BML are omitted. In the fabricating process of the display device 1_3, when the partition walls PTL1, PTL2, and PTL3 are formed, residues of materials forming the partition walls may be generated in the spaces between the partition walls PTL1, PTL2, and PTL3. In order to prevent the display quality of the display device 1_3 from being deteriorated due to generation of the residues of the partition wall material in the display area DA, the dummy area DMA including the dummy pixels DX may be disposed outside the display area DA. Accordingly, light emission may not be substantially performed in the dummy area DMA, and the light blocking member and the color filter may not be disposed therein.

The display device 1_3 according to the present embodiment may include a third trench TR3_3 disposed in the non-display area NDA, and having the alignment key AK arranged therein. In the third trench TR3_3, a third spacer CS3_3 may be disposed to overlap the alignment key AK. The third spacer CS3_3 may include a transparent material so that the alignment key AK is easily visible from the front surface of the display device 1_3.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A display device comprising:
a first substrate;
a second substrate disposed on the first substrate;
first and second partition walls disposed on the second substrate, the second partition wall being disposed outside the first partition wall;
a first trench disposed between the two first partition walls and having a first width;
a second trench disposed between the first and second partition walls and having a second width greater than the first width;
an alignment key disposed on the second substrate and overlapping the second trench;
a first spacer disposed on the alignment key; and
a sealing member disposed along an edge between the first substrate and the second substrate without overlapping the alignment key,
wherein the first spacer partially overlaps the first partition wall, the second partition wall, and the sealing member.

2. The display device of claim 1, wherein the display device includes a dummy area and a sealing area, and
the alignment key is disposed in the sealing area and disposed inside the sealing member.

3. The display device of claim 1, wherein the sealing member does not overlap the first partition wall.

4. The display device of claim 1, wherein a wavelength control pattern is disposed in the first trench.

5. The display device of claim 4, further comprising a second spacer disposed on a partial area of the first partition wall and not overlapping the alignment key.

6. The display device of claim 5, wherein the first spacer and the second spacer are formed by the same process.

7. The display device of claim 6, wherein the first spacer includes a transparent material.

8. The display device of claim 4, wherein the wavelength control pattern includes at least one of a wavelength conversion material or a scattering material.

9. The display device of claim 1, further comprising a filler disposed inside the sealing member between the first substrate and the second substrate.

10. A display device comprising:
a first substrate;
a second substrate disposed on the first substrate;
a sealing member disposed along an edge of the first substrate between the first substrate and the second substrate;
first and second partition walls disposed on the second substrate, the second partition wall being disposed to surround the first partition wall;
an alignment key disposed between the first and second partition walls without overlapping the sealing member; and
a first spacer disposed on the alignment key and partially overlapping the first partition wall and the second partition wall,
wherein the sealing member is disposed on the first spacer and the second partition wall.

11. The display device of claim 10, further comprising a second spacer disposed on a partial area of the first partition wall and not overlapping the alignment key.

12. The display device of claim 11, wherein the first spacer and the second spacer are formed by the same process.

13. The display device of claim 12, wherein the first spacer includes a transparent material.

14. The display device of claim 10, wherein the sealing member does not overlap the first partition wall.

15. The display device of claim 10, further comprising a filler disposed inside the sealing member between the first substrate and the second substrate.

16. The display device of claim 10, wherein the alignment key is disposed on the second substrate and disposed inside the sealing member.

* * * * *